(12) United States Patent
Okumura

(10) Patent No.: US 11,637,199 B2
(45) Date of Patent: Apr. 25, 2023

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/578,079

(22) Filed: Jan. 18, 2022

(65) Prior Publication Data

US 2022/0140136 A1 May 5, 2022

Related U.S. Application Data

(62) Division of application No. 16/726,589, filed on Dec. 24, 2019, now Pat. No. 11,257,945.

(30) Foreign Application Priority Data

Feb. 15, 2019 (JP) .............................. JP2019-025998

(51) Int. Cl.
*H01L 29/78* (2006.01)
*H01L 21/02* (2006.01)
(Continued)

(52) U.S. Cl.
CPC ...... *H01L 29/7813* (2013.01); *H01L 21/0274* (2013.01); *H01L 21/02529* (2013.01);
(Continued)

(58) Field of Classification Search
None
See application file for complete search history.

(56) References Cited

U.S. PATENT DOCUMENTS 5,629,543 A * 5/1997 Hshieh ................ H01L 29/0878
257/330
5,998,837 A * 12/1999 Williams ............ H01L 27/0255
257/341
(Continued)

FOREIGN PATENT DOCUMENTS

JP 2005057049 A 3/2005
JP 2017092368 A 5/2017
(Continued)

OTHER PUBLICATIONS

Japanese Office Action dated Dec. 20, 2022, in the counterpart of Japanese Patent Application No. 2019-025998.

*Primary Examiner* — Vincent Wall
(74) *Attorney, Agent, or Firm* — Rabin & Berdo, P.C.

(57) ABSTRACT

A semiconductor device, including a first semiconductor layer of the first conductivity type formed on a semiconductor substrate, a first semiconductor region of the first conductivity type, a first base region and a first base region, both of a second conductivity type, selectively provided in the first semiconductor layer, a second semiconductor layer of the second conductivity type provided on the first semiconductor layer, a second semiconductor region of the first conductivity type selectively provided in the second semiconductor layer, a trench penetrating the second semiconductor layer and the second semiconductor region, a gate electrode provided in the trench, an interlayer insulating film provided on the gate electrode, a second base region in contact with a bottom of the trench, a first electrode in contact with the second semiconductor layer and the second semiconductor region, and a second electrode provided on the back of the semiconductor substrate.

3 Claims, 12 Drawing Sheets

(51) Int. Cl.
*H01L 21/027* (2006.01)
*H01L 29/36* (2006.01)
*H01L 29/10* (2006.01)
*H01L 29/16* (2006.01)
*H01L 29/423* (2006.01)
*H01L 29/66* (2006.01)

(52) U.S. Cl.
CPC .. *H01L 21/02576* (2013.01); *H01L 21/02579* (2013.01); *H01L 29/1095* (2013.01); *H01L 29/1608* (2013.01); *H01L 29/36* (2013.01); *H01L 29/4236* (2013.01); *H01L 29/66734* (2013.01)

(56) References Cited

U.S. PATENT DOCUMENTS

| | | | | |
|---|---|---|---|---|
| 6,057,578 | A * | 5/2000 | Aiello | H01L 27/0255 257/355 |
| 6,060,742 | A * | 5/2000 | Chi | H01L 29/7885 257/316 |
| 6,525,392 | B1 * | 2/2003 | Leonardi | H01L 21/762 257/499 |
| 7,745,289 | B2 * | 6/2010 | Bencuya | H01L 29/7813 438/270 |
| 7,772,668 | B2 * | 8/2010 | Pan | H01L 29/407 257/492 |
| 10,937,901 | B2 * | 3/2021 | Kinoshita | H01L 29/7813 |
| 10,950,696 | B2 * | 3/2021 | Basler | H01L 29/0878 |
| 2005/0032287 | A1 | 2/2005 | Nakazawa et al. | |
| 2006/0081919 | A1 * | 4/2006 | Inoue | H01L 29/7397 257/330 |
| 2008/0308837 | A1 * | 12/2008 | Gauthier, Jr. | H01L 27/0262 257/107 |
| 2012/0037955 | A1 * | 2/2012 | Hirler | H01L 21/26506 257/140 |
| 2014/0021484 | A1 * | 1/2014 | Siemieniec | H01L 29/7806 257/77 |
| 2017/0141223 | A1 * | 5/2017 | Hoshi | H01L 29/7813 |
| 2017/0221714 | A1 * | 8/2017 | Wakimoto | H01L 29/4236 |
| 2017/0229536 | A1 * | 8/2017 | Stuber | H01L 27/0629 |
| 2018/0033876 | A1 | 2/2018 | Sugahara et al. | |
| 2018/0033885 | A1 * | 2/2018 | Okumura | H01L 21/02529 |
| 2018/0138264 | A1 * | 5/2018 | Kinoshita | H01L 29/36 |
| 2018/0233564 | A1 * | 8/2018 | Kumada | H01L 29/167 |
| 2019/0140091 | A1 * | 5/2019 | Kinoshita | H01L 29/1608 |
| 2019/0206987 | A1 | 7/2019 | Adachi et al. | |
| 2019/0288073 | A1 * | 9/2019 | Okumura | H01L 29/7813 |
| 2020/0220008 | A1 * | 7/2020 | Takeuchi | H01L 29/1095 |
| 2020/0243404 | A1 * | 7/2020 | Kaji | H01L 29/0623 |
| 2020/0295182 | A1 * | 9/2020 | Hoshi | H01L 29/7813 |

FOREIGN PATENT DOCUMENTS

| | | |
|---|---|---|
| JP | 2018-019046 A | 2/2018 |
| JP | 2018-082055 A | 5/2018 |
| WO | 2017187670 A1 | 11/2017 |

* cited by examiner

SEMICONDUCTOR DEVICE AND METHOD OF MANUFACTURING SEMICONDUCTOR DEVICE

CROSS REFERENCE TO RELATED APPLICATIONS

This is a divisional application of U.S. application Ser. No. 16/726,589 filed on Dec. 24, 2019, which is based upon and claims the benefit of priority of the prior Japanese Patent Application No. 2019-025998, filed on Feb. 15, 2019, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce element ON resistance in a power semiconductor element, a vertical metal oxide semiconductor field effect transistor (MOSFET) having a trench structure is fabricated (manufactured). In a vertical MOSFET, cell density per unit area may be increased more for a trench structure in which a channel is formed orthogonally to a substrate surface than for a planar structure in which the channel is formed parallel to the substrate surface. Accordingly, a trench structure enables current density per unit area to be increased more than does a planar structure and is more advantageous in terms of cost.

Nonetheless, a vertical MOSFET having a trench structure has a structure in which an entire inner wall region of a trench is covered by a gate insulating film to form the channel in an orthogonal direction and since a bottom portion of the gate insulating film at a bottom of the trench is near a drain electrode, high electric field is easily applied to a portion of the gate insulating film at the bottom of the trench. In particular, since an ultra-high voltage element is fabricated using a wide bandgap semiconductor material (semiconductor material having a bandgap wider than that of silicon, for example, silicon carbide (SiC)), the gate insulating film at the bottom of the trench is adversely affected, thereby greatly reducing reliability.

As a method to solve such problems and to mitigate electric field strength at the bottom of the trench, a structure has been proposed in which a p-type region is formed that is in contact with a p-type base region and reaches a position deeper than is a bottom of a trench, a pn junction is formed at a position deeper than the bottom of the trench and near the trench, and a p-type region is further formed at the bottom of the trench.

FIG. 17 is a cross-sectional view of a structure of a conventional silicon carbide semiconductor device. A trench-type MOSFET 150 is depicted as a conventional silicon carbide semiconductor device. In the trench-type MOSFET 150, at a front surface of an n$^+$-type silicon carbide substrate 101, an n$^-$-type silicon carbide epitaxial layer 102 is deposited. In an upper portion of the n$^-$-type silicon carbide epitaxial layer 102, opposite a lower portion thereof facing the n$^+$-type silicon carbide substrate 101, an n-type high-concentration region 105 is provided. Further, in the n-type high-concentration region 105, a first p$^+$-type base region 104 is selectively provided so as to underlie a bottom of a trench 116 overall. In an upper portion of the n-type high-concentration region 105, opposite a lower portion thereof facing toward the n$^+$-type silicon carbide substrate 101, a second p$^+$-type base region 103 is selectively provided.

In the conventional trench-type MOSFET 150, a p-type base layer 106, an n$^+$-type source region 107, a p$^{++}$-type contact region 108, a gate insulating film 109, a gate electrode 110, an interlayer insulating film 111, a source electrode 112, a rear electrode 113, a source electrode pad 114, and a drain electrode pad 115 are further provided.

In the trench-type MOSFET 150 of the configuration in FIG. 17, pn junctions between p-type regions (the first p$^+$-type base region 104 and the second p$^+$-type base region 103) and the n-type high-concentration region 105 are positioned deeper than the trench 116 and therefore, electric field concentrates at borders between the p-type regions and the n-type high-concentration region 105, thereby enabling electric field concentration at the bottom of the trench 116 to be mitigated.

Further, in the conventional structure depicted in FIG. 17, the first p$^+$-type base region 104 is formed so as to be positioned beneath the trench 116 and therefore, the first p$^+$-type base region 104 has to be formed widely with consideration of process margin. Thus, when cell pitch is to be reduced, photolithography of higher precision is necessary, increasing the degree of manufacturing difficulty and limiting the extent of reductions in element size. On the other hand, when the first p$^+$-type base region 104 is not provided, the electric field concentration at the bottom of the trench 116 cannot be mitigated and thus, targeted breakdown voltage cannot be realized.

Therefore, a technique has been proposed in which in a vertical MOSFET with a trench structure having a planar pattern of a striped shape, a p$^+$-type base region having a striped shape orthogonal to a direction along which the striped shape of the trench extends is provided beneath the trench.

FIG. 18 is a perspective view of another structure of the conventional silicon carbide semiconductor device. FIG. 19 is a cross-sectional view along cutting line A-A' in FIG. 18 depicting the other structure of the conventional silicon carbide semiconductor device. FIG. 20 is a plan sectional view of a portion along cutting line B-B' in FIG. 18 depicting the other structure of the conventional silicon carbide semiconductor device. As depicted in FIGS. 18 to FIG. 20, in the n-type high-concentration region 105, the first p$^+$-type base region 104 is selectively provided orthogonally to the trench 116 so as to partially underlie the bottom of the trench 116.

In the trench-type MOSFET 150 of the configuration in FIGS. 18 to 20 as well, the pn junction between the first p$^+$-type base region 104 and the n-type high-concentration region 105 is positioned deeper than the trench 116 and therefore, electric field concentrates at the border between the first p$^+$-type base region 104 and the n-type high-concentration region 105, thereby enabling electric field concentration at the bottom of the trench 116 to be mitigated.

Further, a technique has been proposed in which in a first silicon carbide layer, a first impurity layer in which a bottom of a trench is formed and a second impurity layer are formed, a first-conductivity-type impurity concentration directly beneath the first impurity layer in the first silicon carbide layer is set lower than a first-conductivity-type impurity concentration directly beneath the second impurity layer in the first silicon carbide layer, whereby breakdown voltage of the first impurity layer is made higher than breakdown voltage of the second impurity layer and avalanche breakdown is selectively caused in the second impurity layer (for example, refer to Japanese Laid-Open Patent Publication No. 2018-19046).

Further, a technique has been proposed in which a base region of a second conductivity type is selectively provided in a surface layer of a wide bandgap semiconductor layer of a first conductivity type and a trench having a planar pattern of a striped shape is provided while a base region is periodically provided in a direction parallel to the trench and at a bottom of the trench, a portion of the base region extends in a direction parallel to the trench, thereby connecting the base regions to each other (for example, refer to Japanese Laid-Open Patent Publication No. 2018-82055).

SUMMARY OF THE INVENTION

According to an embodiment of the invention, a semiconductor device includes a semiconductor substrate of a first conductivity type, having a front surface and a back surface opposite to each other; a first semiconductor layer of the first conductivity type, provided on the front surface of the semiconductor substrate and having a first side facing the semiconductor substrate and a second side opposite to the first side, an impurity concentration of the first semiconductor layer being lower than that of the semiconductor substrate; a first semiconductor region of the first conductivity type, selectively provided in the first semiconductor layer, a peak impurity concentration of the first semiconductor region being higher than that of the first semiconductor layer; a first base region of a second conductivity type, selectively provided in the first semiconductor layer; a second semiconductor layer of the second conductivity type, provided on a surface of the first semiconductor layer at the second side thereof; a second semiconductor region of the first conductivity type, selectively provided in the second semiconductor layer at a surface thereof; a trench that penetrates the second semiconductor layer and the second semiconductor region, and reaches the first semiconductor layer; a gate electrode provided in the trench, via a gate insulating film; an interlayer insulating film provided on the gate electrode; a first electrode in contact with the second semiconductor layer and the second semiconductor region; and a second electrode provided on the back surface of the semiconductor substrate. The trench includes a plurality of trench portions, each of which extends in a first direction. The first semiconductor region is provided between adjacent two of the plurality of trench portions, and is closer to the second electrode than is the first base region. The first base region extends along a second direction that intersects the first direction, at a depth that is the same as a bottom of the trench, or is closer to the second electrode than is the bottom of the trench.

In the embodiment, the first base region includes a plurality of first base region portions, and an interval between any adjacent two of the first base region portions is shorter than an interval between any adjacent two of the trench portions.

In the embodiment, the first base region includes a plurality of first base region portions, and an interval between any adjacent two of the first base region portions is in a range from 0.8 μm to 5 μm.

In the embodiment, a second base region in contact with the bottom of the trench, in a direction parallel to the first direction.

In the embodiment, the second base region has a same impurity concentration as that of the first base region.

In the embodiment, the first base region includes a plurality of first base region portions. The second base region includes a plurality of second base region portions, and an interval between any adjacent two of the second base region portions is of a same width as an interval between any adjacent two of the first base region portions.

In the embodiment, the first base region includes a plurality of first base region portions. The second base region includes a plurality of second base region portions. The first semiconductor region includes a plurality of first semiconductor region portions, and a width of each of the first base region portions or a width of each of the second base region portions is wider than a width of each of the first semiconductor region portions.

In the embodiment, the semiconductor device further includes a third semiconductor region of the second conductivity type, selectively provided in the second semiconductor layer. The first semiconductor region is provided at a position facing the third semiconductor region in a depth direction.

In the embodiment, the first semiconductor region includes a plurality of first semiconductor region portions, each between adjacent two of the plurality of trench portions, and extending in a direction parallel to the first direction.

In the embodiment, the first semiconductor region is provided separated from the first base region.

In the embodiment, an impurity concentration of the first semiconductor region is lower than an impurity concentration of the first base region.

In the embodiment, an impurity concentration of the first semiconductor region is in a range from $1\times10^{17}/cm^3$ to $1\times10^{20}/cm^3$.

In the embodiment, an angle between the first and second directions is one of 30 degrees, 60 degrees, 90 degrees, 120 degrees or 150 degrees.

In the embodiment, the angle has a margin of ±4 degrees.

According to another embodiment, a method of manufacturing a semiconductor device includes providing a semiconductor substrate of a first conductivity type, the semiconductor substrate having a front surface and a back surface opposite to each other; forming, on the front surface of the semiconductor substrate, a first semiconductor layer of the first conductivity type, the first semiconductor layer having an impurity concentration lower than that of the semiconductor substrate and having a first side facing the semiconductor substrate and a second side opposite to the first side; selectively forming, in the first semiconductor layer, a first semiconductor region of the first conductivity type, the first semiconductor region having a peak impurity concentration higher than that of the first semiconductor layer; selectively forming, in the first semiconductor layer, a first base region of a second conductivity type; forming, on a surface of the first semiconductor layer at the second side thereof, a second semiconductor layer of the second conductivity type; selectively forming, in the second semiconductor layer at a surface thereof, a second semiconductor region of the first conductivity type; forming a trench that penetrates the second semiconductor layer and the second semiconductor region, and reaches the first semiconductor layer; forming, in the trench, a gate electrode via a gate insulating film; forming an interlayer insulating film on the gate electrode; forming a first electrode in contact with the second semiconductor layer and the second semiconductor region; and forming a second electrode on the back surface of the semiconductor substrate. Forming a trench includes forming a plurality of trench portions, each of which extends in a first direction. Forming the first semiconductor region includes forming a plurality of first semiconductor region portions, each between adjacent two of the trench portions, the first semiconductor region being closer to the second electrode than is the first base region. Forming the first base region includes forming the first base region along a second direction intersecting the first direction, at a depth that is the same as a bottom of the trench, or is closer to the second electrode than is the bottom of the trench.

Objects, features, and advantages of the present invention are specifically set forth in or will become apparent from the following detailed description of the invention when read in conjunction with the accompanying drawings.

DETAILED DESCRIPTION OF THE INVENTION

Figure 17:
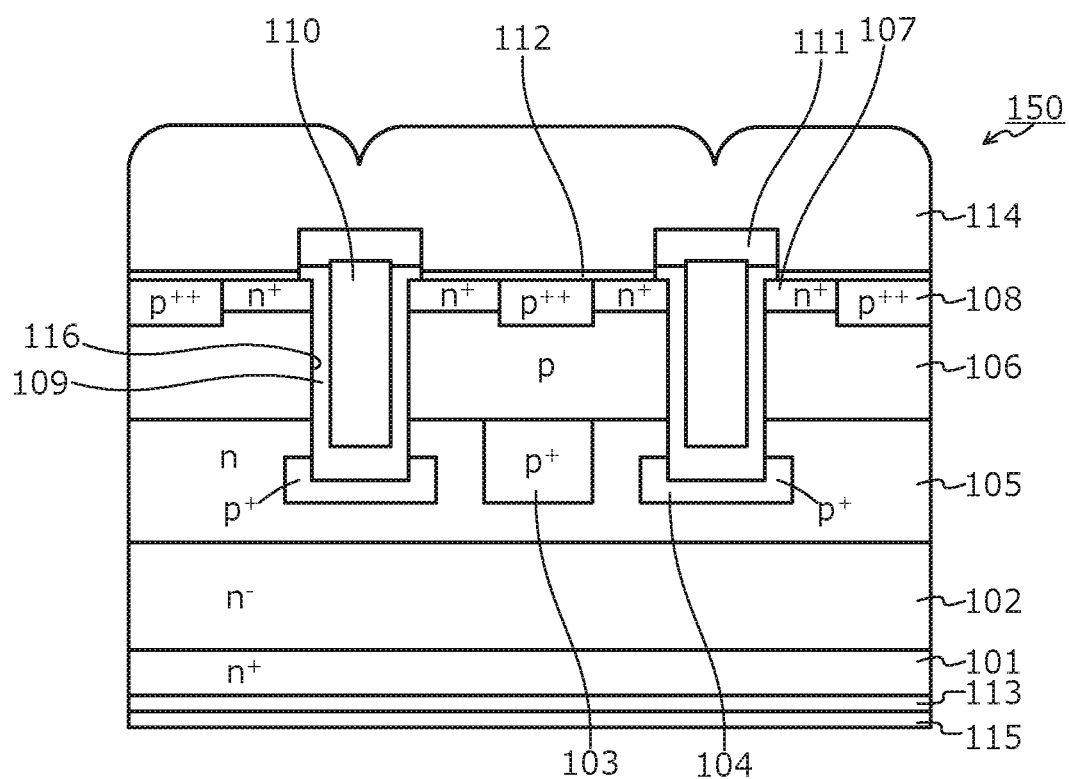
FIG. 17 is a cross-sectional view of a structure of a conventional silicon carbide semiconductor device.

First, problems associated with the conventional techniques will be described. In the conventional silicon carbide semiconductor device depicted in FIG. 17, breakdown voltage with respect to drain voltage at the first $p^+$-type base region 104 of the bottom of the trench 116 and breakdown voltage with respect to drain voltage at the second $p^+$-type base region 103 beneath the $p^{++}$-type contact region 108 are substantially the same. Therefore, the breakdown voltage of the first $p^+$-type base region 104 at the bottom of the trench 116 may be less than the breakdown voltage of the second $p^+$-type base region 103 beneath the $p^{++}$-type contact region 108; and in this case, breakdown voltage of the element overall is determined by the breakdown voltage of the bottom of the trench 116.

Accordingly, avalanche breakdown occurs at the bottom of the trench 116, whereby carriers are injected to the gate insulating film 109 at the bottom of the trench 116 and the injected carriers are captured in a carrier trap in the gate insulating film 109, thereby modulating local electric field in the gate insulating film 109. Further, due to variation of the local electric field, the local electric field becomes stronger, whereby a vicious circle arises in which further carrier injection occurs and the gate insulating film 109 may be destroyed.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
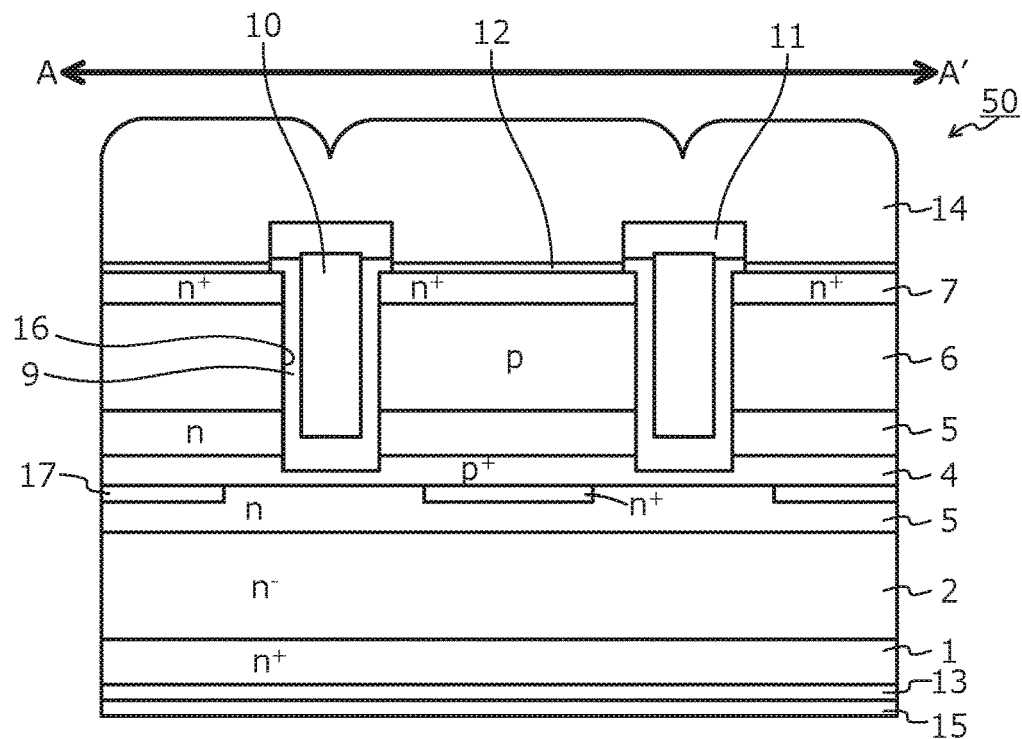
FIG. 1 is a cross-sectional view of a structure of a silicon carbide semiconductor device according to a first embodiment, along cutting line A-A' in FIG. 3A.
Figure 2:
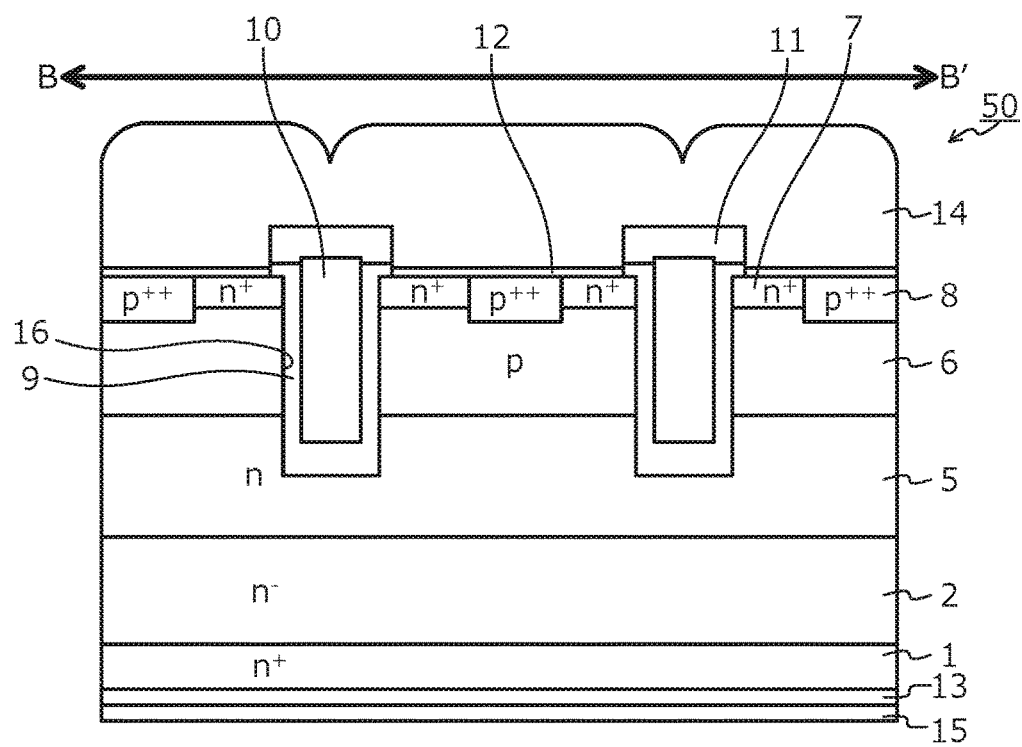
FIG. 2 is a cross-sectional view of the structure of the silicon carbide semiconductor device according to the first embodiment, along cutting line B-B' in FIG. 3A.

A semiconductor device according to the present invention is configured using a wide bandgap semiconductor. In a first embodiment, a silicon carbide semiconductor device fabricated using, for example, silicon carbide (SiC) as the wide bandgap semiconductor will be described taking a MOSFET as an example. FIG. 1 is a cross-sectional view of a structure of the silicon carbide semiconductor device according to the first embodiment, along cutting line A-A' in FIG. 3A. FIG. 2 is a cross-sectional view of the structure of the silicon carbide semiconductor device according to the first embodiment, along cutting line B-B' in FIG. 3A. FIGS. 1 to 3B depict an example of a trench-type MOSFET 50.

As depicted in FIGS. 1 and 2, in the silicon carbide semiconductor device according to the first embodiment, at a first main surface (front surface), for example, a (0001) plane (Si-face), of an $n^+$-type silicon carbide substrate (semiconductor substrate of a first conductivity type) 1, an $n^-$-type silicon carbide epitaxial layer (first semiconductor layer of the first conductivity type) 2 is deposited.

The $n^+$-type silicon carbide substrate 1 is a silicon carbide single crystal substrate. The $n^-$-type silicon carbide epitaxial layer 2 has an impurity concentration lower than that of the $n^+$-type silicon carbide substrate 1 and, for example, is a low-concentration n-type drift layer. At a surface of the $n^-$-type silicon carbide epitaxial layer 2, on a first side thereof opposite a second side thereof facing the $n^+$-type silicon carbide substrate 1, an n-type high-concentration region (first semiconductor layer of the first conductivity type) 5 may be provided. The n-type high-concentration region 5 is a high-concentration n-type drift layer having an impurity concentration lower than that of the $n^+$-type silicon carbide substrate 1 and higher than that of the $n^-$-type silicon carbide epitaxial layer 2.

In an upper portion of the $n^-$-type silicon carbide epitaxial layer 2, opposite a lower portion thereof facing the $n^+$-type silicon carbide substrate 1, a p-type base layer (second semiconductor layer of a second conductivity type) 6 is provided. Hereinafter, the $n^+$-type silicon carbide substrate 1, the $n^-$-type silicon carbide epitaxial layer 2, and the p-type base layer 6 collectively are a silicon carbide semiconductor base.

At a second main surface (back surface, i.e., back surface of the silicon carbide semiconductor base) of the $n^+$-type silicon carbide substrate 1, a drain electrode forming a rear electrode (second electrode) 13 is provided. At a surface of the rear electrode 13, a drain electrode pad 15 is provided.

At a first main surface side (side with the p-type base layer 6) of the silicon carbide semiconductor base, a trench structure is formed. In particular, from a surface of the p-type base layer 6 on a first side (first main surface side of the silicon carbide semiconductor base) thereof opposite a second side thereof facing toward the $n^+$-type silicon carbide substrate 1, a trench 16 penetrates the p-type base layer 6 and reaches the n-type high-concentration region 5 (when the n-type high-concentration region 5 is not provided, the $n^-$-type silicon carbide epitaxial layer 2, hereinafter, (2)). The trench 16 has a planar pattern of a striped shape. Along an inner wall of the trench 16, a gate insulating film 9 is formed at side walls and a bottom of the trench 16, and a gate electrode 10 is formed on the gate insulating film 9 in the trench 16. The gate electrode 10 is insulated from the $n^-$-type silicon carbide epitaxial layer 2 and the p-type base layer 6 by the gate insulating film 9. A portion of the gate electrode 10 may protrude from a top (side where a source electrode pad 14 is provided) of the trench 16, toward the source electrode pad 14.

In the $n^-$-type silicon carbide epitaxial layer 2, a first $p^+$-type base region 4 that is in contact with the bottom of the trench 16 is provided along a direction orthogonal to a direction in which the striped shape of the trench 16 extends. In FIG. 1, while the first $p^+$-type base region 4 is in contact with the bottom of the trench 16, the first $p^+$-type base region 4 may be provided at a position deeper than the bottom of the trench 16. The first $p^+$-type base region 4 reaches a position deeper toward a drain side than is the bottom of the trench 16. Provision of the first $p^+$-type base region 4 enables formation of a pn junction between the first $p^+$-type base region 4 and the n-type high-concentration region 5 (2) at a position near the bottom of the trench 16, in a depth direction (direction from the source electrode pad 14 toward the drain electrode pad 15). In this manner, the pn junction between the first $p^+$-type base region 4 and the n-type high-concentration region 5 (2) is formed, whereby high electric field may be prevented from being applied to the gate insulating film 9 at the bottom of the trench 16. Therefore, even when a wide bandgap semiconductor is used as a semiconductor material, high breakdown voltage is possible. In the first embodiment, a case is depicted in which intersection of the direction along which the striped shape of the trench 16 extends and the direction along which the first $p^+$-type base region 4 is orthogonal, i.e., 90 degrees. Other than orthogonal (90 degrees), an angle of the intersection may be any one of 30 degrees, 60 degrees, 120 degrees, or 150 degrees. By setting the angle of intersection to any one of 30 degrees, 60 degrees, 90 degrees, 120 degrees, and 150 degrees, the hexagonal crystalline silicon carbide and surface orientation are aligned, mobility is easy, and a tradeoff between Vth threshold and ON resistance RonA may be optimized. Further, with consideration of manufacturing variation, when the angle of intersection is 30 degrees, 60 degrees, 90 degrees, 120 degrees, or 150 degrees, a margin thereof is within ±4 degrees and may be within ±2 thereof.

In the first embodiment, an $n^+$-type region (first semiconductor region of the first conductivity type) 17 having a peak impurity concentration higher than the n-type high-concentration region 5 (2) is provided in the n-type high-concentration region 5 (2), between the trench 16 and an adjacent trench 16, at a position deeper than the first $p^+$-type base region 4. The peak impurity concentration of the $n^+$-type region 17 suffices to be higher than the impurity concentration of the n-type high-concentration region 5 (2) and the impurity concentration of all regions of the $n^+$-type region 17 needs not be higher than of the n-type high-concentration region 5 (2). Further, when the n-type high-concentration region 5 is not provided, the $n^+$-type region 17 has a peak impurity concentration that is higher than the impurity concentration of the $n^-$-type silicon carbide epitaxial layer 2. Moreover, the $n^+$-type region 17 may have an impurity concentration that is lower than the impurity concentration of the first $p^+$-type base region 4.

The $n^+$-type region 17 enables setting the part that determines element breakdown voltage to be the first $p^+$-type base region 4 between the trench 16 and the adjacent trench 16, and not the first $p^+$-type base region 4 at the bottom of the trenches 16. In other words, the breakdown voltage of the first $p^+$-type base region 4 at the bottom of the trench 16 may be higher than the breakdown voltage of the first $p^+$-type base region 4 between the trench 16 and the adjacent trench 16.

Therefore, by selectively concentrating electric field at the $n^+$-type region 17, avalanche breakdown is caused and the generation of avalanche current at the bottom of the trench 16 may be suppressed. Therefore, for example, modulation of local electric field in the gate insulating film 9 due to carrier injection to the gate insulating film 9 at the bottom of the trench 16, and insulation breakdown of the gate insulating film 9 may be suppressed. In this manner, the $n^+$-type region 17 enables avalanche beneath the trench to be avoided and reliability to be increased.

Further, the impurity concentration of the $n^+$-type region 17 may be in a range from $1 \times 10^{17}/cm^3$ to $1 \times 10^{20}/cm^3$. When the impurity concentration is less than $1 \times 10^{17}/cm^3$, electric field cannot be concentrated at the $n^+$-type region 17 and when higher than $1 \times 10^{20}/cm^3$, element performance falls below a rated value.

Figure 3A:
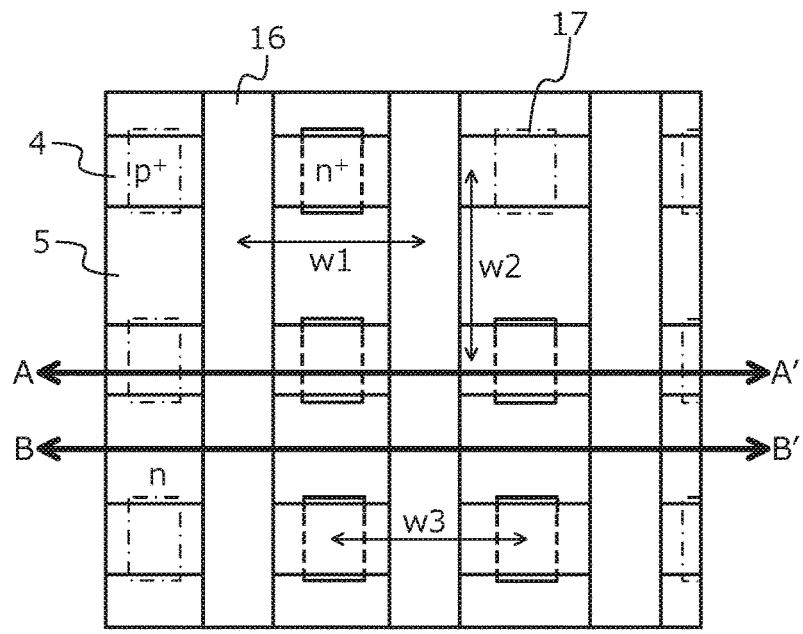
FIG. 3A is a plan sectional view of the structure of the silicon carbide semiconductor device according to the first embodiment.
Figure 3B:
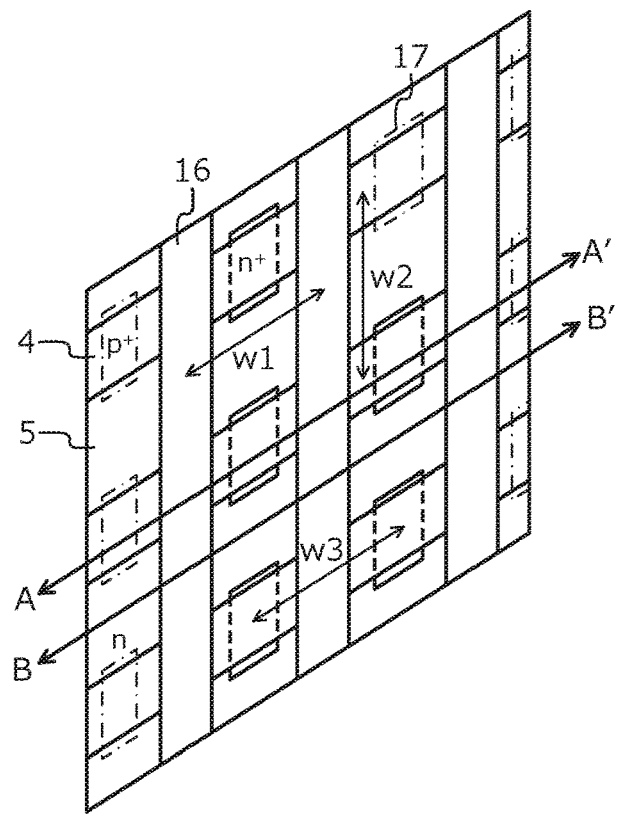
FIG. 3B is a plan sectional view of a different structure in FIG. 3A.

FIG. 3A is a plan sectional view of the structure of the silicon carbide semiconductor device according to the first embodiment. FIG. 3A schematically depicts a positional relationship between the trench 16, the first $p^+$-type base region 4, and the $n^+$-type region 17. As depicted in FIG. 3A, the trench 16 and the first $p^+$-type base region 4 both have striped shapes and directions in which the striped shapes extend are orthogonal to each other. The $n^+$-type region 17 is selectively provided in the first $p^+$-type base region 4 between the trench 16 and the trench 16. In this manner, in the first embodiment, the trench 16 and the first $p^+$-type base region 4 are orthogonal to each other and therefore, even when cell pitch is reduced, the trench 16 and the first $p^+$-type base region 4 do not become misaligned, whereby a state in which the first $p^+$-type base region 4 is not positioned at the bottom of the trench 16 may be prevented. With consideration of manufacturing variation, orthogonality is within ±4 degrees and may be within ±2 degrees. FIG. 3B is a plan sectional view of a different structure in FIG. 3A. While FIG. 3A depicts a case in which the intersection between the direction in which the striped shape of the trench 16 extends and the direction in which the first $p^+$-type base region 4 extends is orthogonal, i.e., 90 degrees, FIG. 3B depicts a case in which the intersecting angle is 30 degrees.

Further, an interval w1 between the trenches 16 may be wider than an interval w2 between the first $p^+$-type base region 4 and an adjacent first $p^+$-type base region 4 (w1>w2). The interval w1 between the trenches 16 is a distance between a center of the trench 16 and a center of the adjacent trench 16 that is adjacent to the trench 16. Further, the interval w2 between the first $p^+$-type base regions 4 is a distance between a center of the first $p^+$-type base region 4 and a center of the adjacent first $p^+$-type base region 4 that is adjacent to the first $p^+$-type base region 4. The $n^+$-type region 17 is provided near a center between the trench 16 and the adjacent trench 16. Therefore, the interval w1 between the trenches 16 is about an interval w3 between $n^+$-type regions 17. Further, the interval w3 between the $n^+$-type regions 17 is a distance between a center of the $n^+$-type region 17 and the center of an adjacent $n^+$-type region 17 that is adjacent to the $n^+$-type region 17. In this manner, as compared to the conventional structure in which the interval of the trenches 116 and the interval of the first $p^+$-type base regions 104 are equal, the ON resistance and the electric field may be concurrently reduced and breakdown voltage of the first $p^+$-type base region 4 between the trenches 16 may be easily reduced.

Further, the interval w2 of the first $p^+$-type base regions 4 may be in a range from 0.8 μm to 5 μm because when less than 0.8 μm, resistance of a junction field effect transistor (JFET) region increases and when greater than 5 μm, an effect of protecting the gate insulating film 9 at the bottom of the trench 16 is reduced.

Further, the $n^+$-type region 17 is provided beneath (direction from the source electrode pad 14 toward the drain electrode pad 15) portions of the first $p^+$-type base region 4 between the trenches 16, thereby enabling the position where electric field concentrates to be controlled. Furthermore, as compared to providing the $n^+$-type region 17 beneath the first $p^+$-type base region 4 overall, a similar effect may be obtained by a lower nitrogen dose amount and since the dose amount is lower, the number of ion implantation stages may be reduced.

Figure 18:
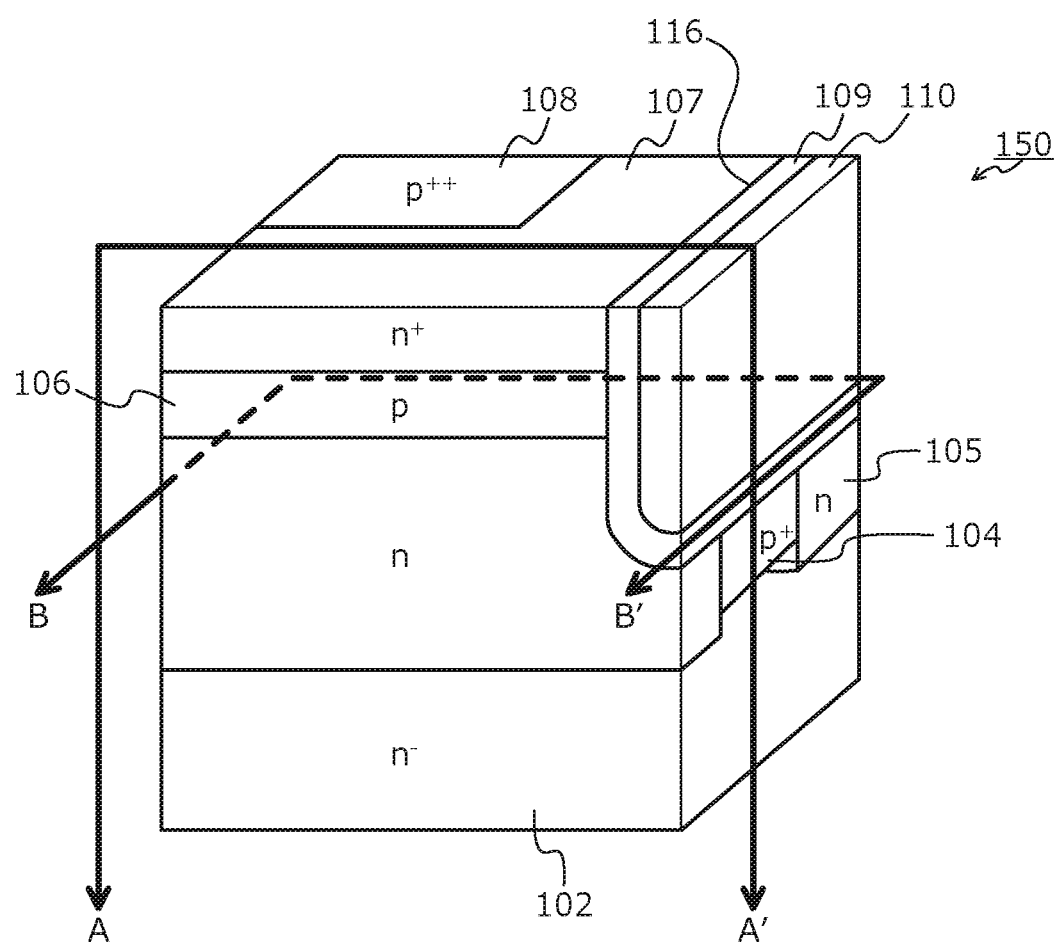
FIG. 18 is a perspective view of another structure of the conventional silicon carbide semiconductor device.
Figure 19:
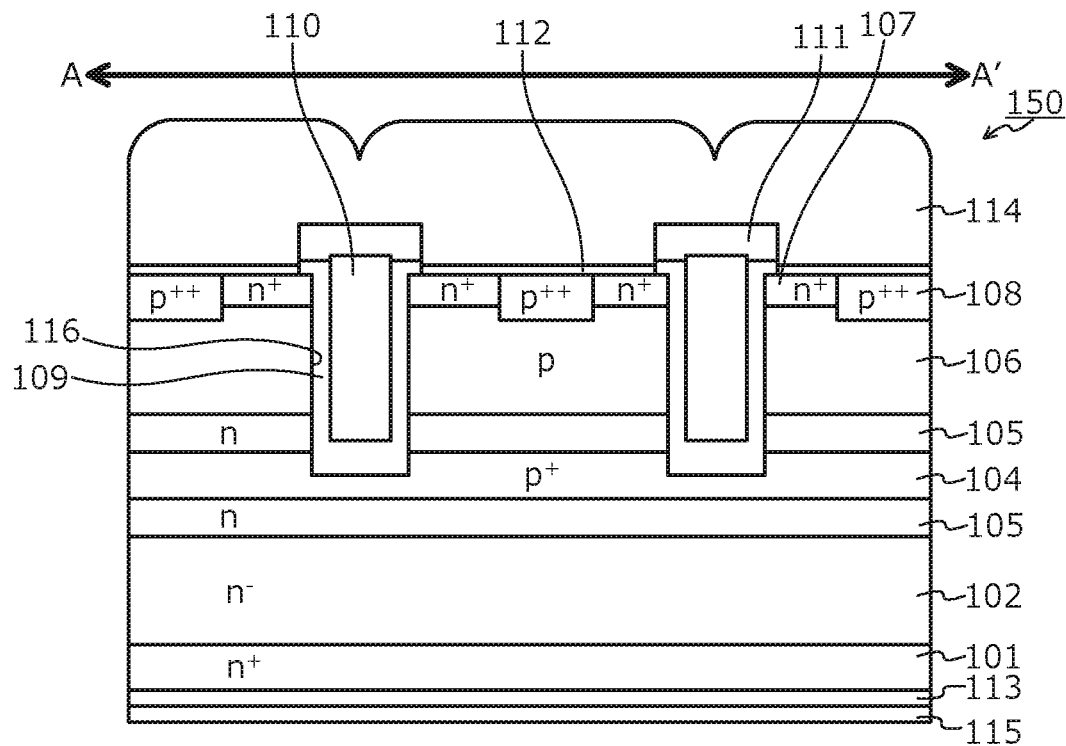
FIG. 19 is a cross-sectional view along cutting line A-A' in FIG. 18 depicting the other structure of the conventional silicon carbide semiconductor device.
Figure 20:
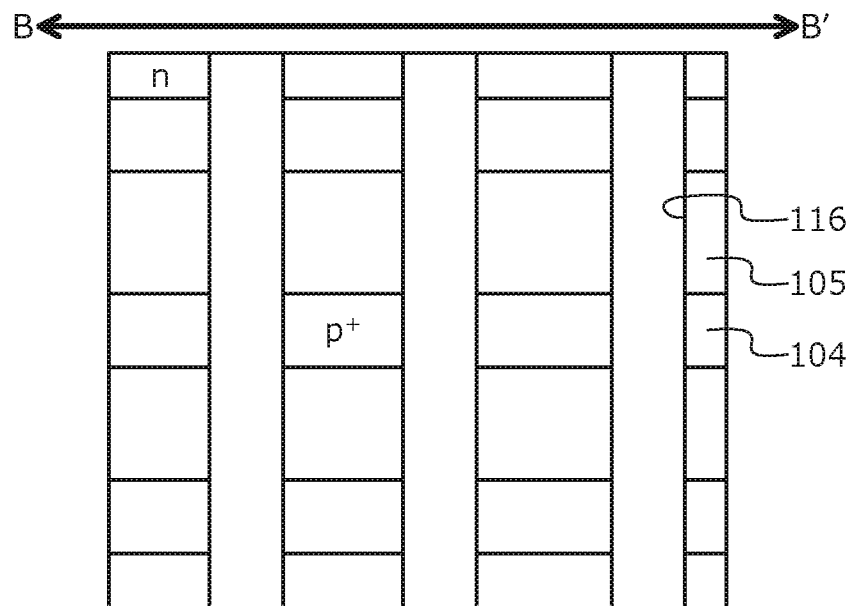
FIG. 20 is a plan sectional view of a portion along cutting line B-B' in FIG. 18 depicting the other structure of the conventional silicon carbide semiconductor device.

As depicted in FIGS. 1 and 2, in the p-type base layer 6, an $n^+$-type source region (second semiconductor region of the first conductivity type) 7 is provided at the first main surface side of the silicon carbide semiconductor base. A $p^{++}$-type contact region (third semiconductor region of the second conductivity type) 8 may be selectively provided. Further, the $n^+$-type source region 7 and the $p^{++}$-type contact region 8 are in contact with each other. Further, the $p^{++}$-type contact region 8 is selectively provided along the direction in which the striped shape of the trench 16 extends (refer to FIG. 18). For example, as depicted in FIGS. 1 and 2, the $p^{++}$-type contact region 8 may be provided in only portions where the first $p^+$-type base region 4 is not provided.

An interlayer insulating film 11 is provided at the first main surface side of the silicon carbide semiconductor base overall, so as to cover the gate electrode 10 embedded in the trench 16. A source electrode (first electrode) 12, via a contact hole opened in the interlayer insulating film 11, is in contact with the $n^+$-type source region 7 and the $p^{++}$-type contact region 8 (when the $p^{++}$-type contact region 8 is not provided, the p-type base layer 6). The source electrode 12 is electrically insulated from the gate electrode 10 by the interlayer insulating film 11. On the source electrode 12, the source electrode pad 14 is provided.

In FIGS. 1 and 2, while only two cells (a structure formed by the trench 16, the gate insulating film 9, the gate electrode 10, the interlayer insulating film 11 and the source electrode 12) are depicted, more cells of a MOS gate (insulated gate formed by a metal, an oxide film, and a semiconductor) structure may be further disposed in parallel.

Figure 4:
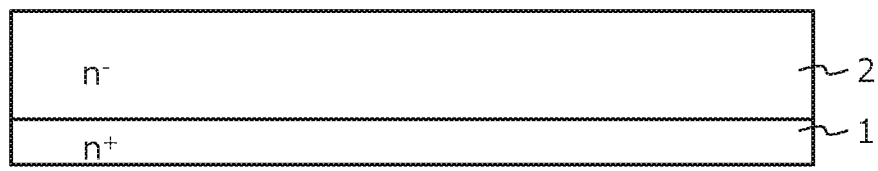
FIG. 4 is a cross-sectional view of the silicon carbide semiconductor device according to the first embodiment during manufacture.
Figure 5A:
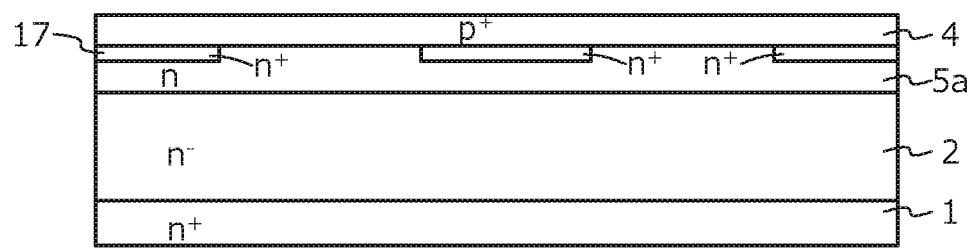
FIG. 5A is a cross-sectional view of the silicon carbide semiconductor device according to the first embodiment during manufacture.
Figure 5B:
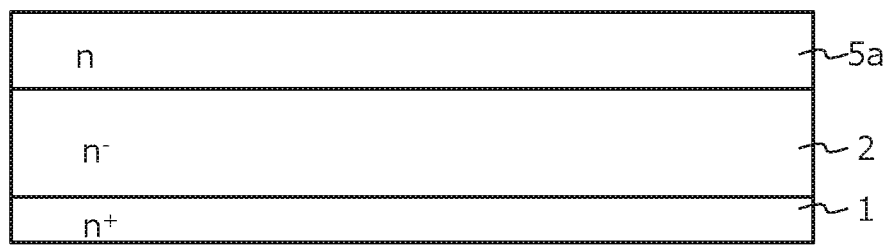
FIG. 5B is a cross-sectional view of the silicon carbide semiconductor device according to the first embodiment during manufacture.
Figure 6A:
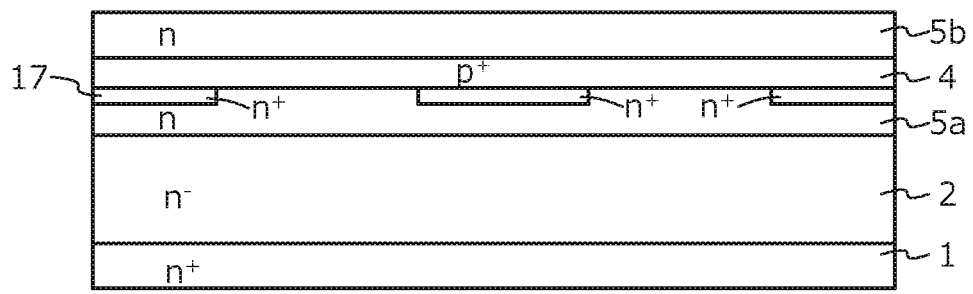
FIG. 6A is a cross-sectional view of the silicon carbide semiconductor device according to the first embodiment during manufacture.
Figure 6B:
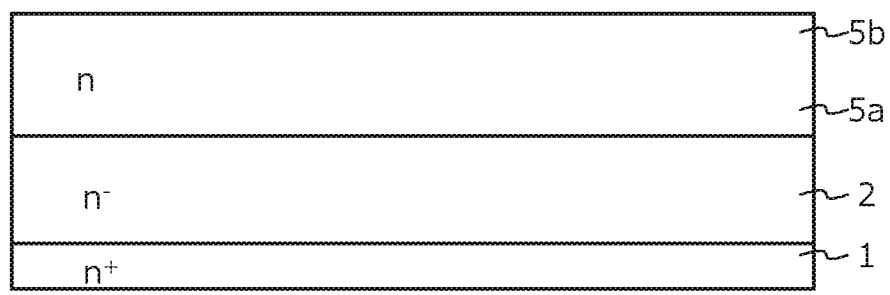
FIG. 6B is a cross-sectional view of the silicon carbide semiconductor device according to the first embodiment during manufacture.
Figure 7A:
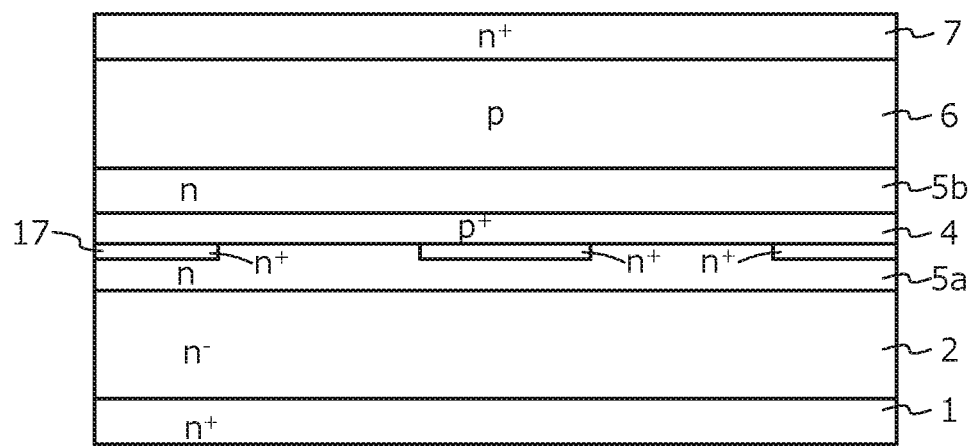
FIG. 7A is a cross-sectional view of the silicon carbide semiconductor device according to the first embodiment during manufacture.
Figure 7B:
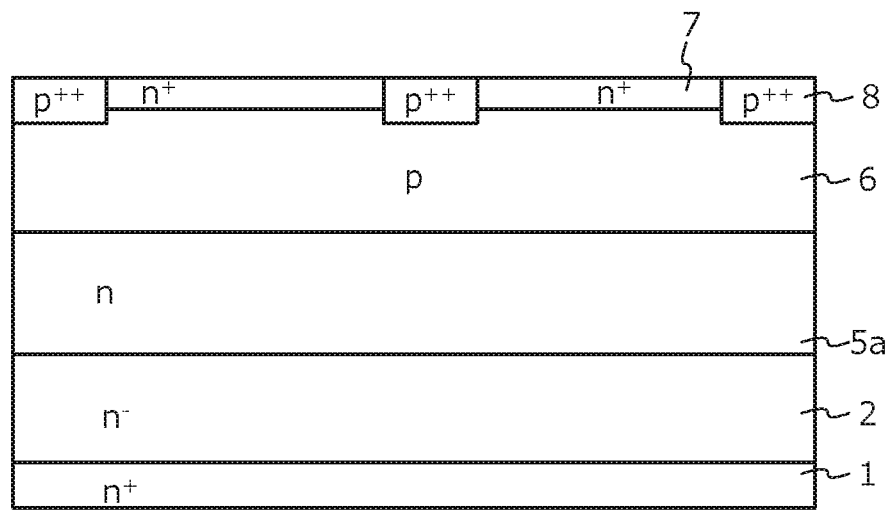
FIG. 7B is a cross-sectional view of the silicon carbide semiconductor device according to the first embodiment during manufacture.

A method of manufacturing a silicon carbide semiconductor device according to an embodiment will be described. FIGS. 4, 5A, 5B, 6A, 6B, 7A, 7B, 8, and 9 are cross-sectional views of the silicon carbide semiconductor device according to the present embodiment during manufacture. Here, FIGS. 5A, FIG. 6A, and FIG. 7A are cross-sectional views of the silicon carbide semiconductor device according to the present embodiment during manufacture and correspond to FIG. 1. FIGS. 5B, 6B, and 7B are cross-sectional views of the silicon carbide semiconductor device according to the present embodiment during manufacture and correspond to FIG. 2.

First, the $n^+$-type silicon carbide substrate 1 containing an n-type silicon carbide is prepared. Then, on the first main surface side of the $n^+$-type silicon carbide substrate 1, the $n^-$-type silicon carbide epitaxial layer 2 containing silicon carbide is formed by epitaxial growth to have a thickness of, for example, about 30 μm while an n-type impurity, for example, nitrogen atoms (N), is doped. The state up to here is depicted in FIG. 4.

Next, at the surface of the $n^-$-type silicon carbide epitaxial layer 2, an n-type impurity, for example, nitrogen atoms, may be ion implanted by an ion implantation method. As a result, in a surface layer of the $n^-$-type silicon carbide epitaxial layer 2, a first n-type region 5a having, for example, a depth of 0.5 μm or less is formed. A dose amount during ion implantation for forming the first n-type region 5a, for example, may be set so that the impurity concentration becomes about $1\times10^{17}/cm^3$.

Next, on the surface of the first n-type region 5a (2), a non-depicted mask having predetermined openings is formed by a photolithography technique using, for example, an oxide film. Then, using the oxide film as a mask, an n-type impurity, for example, nitrogen atoms, is ion implanted by an ion implantation method. As a result, in a surface layer of the first n-type region 5a (2), the $n^+$-type region 17 is formed. Further, the $n^+$-type region 17, similarly to the first n-type region 5a (2), is formed by ion implantation of nitrogen atoms and therefore, may be formed by self-alignment with the first n-type region 5a (2).

Next, the mask used during the ion implantation for forming the $n^+$-type region 17 is removed. Then, on the surface of the first n-type region 5a (2) and the surface of the $n^+$-type region 17, a non-depicted mask having predetermined openings is formed by a photolithography technique using, for example, an oxide film. Then, using the oxide film as a mask, a p-type impurity, for example, aluminum atoms (Al), is ion implanted by an ion implantation method. As a result, at surface regions of the $n^+$-type region 17 and the first n-type region 5a (2) in the surface layer of the $n^-$-type silicon carbide epitaxial layer 2, the first $p^+$-type base region 4 having, for example, a depth of about 0.5 μm is formed. A dose amount during ion implantation for forming the first $p^+$-type base region 4, for example, may be set so that the impurity concentration becomes about $5\times10^{18}/cm^3$. The state up to here is depicted in FIGS. 5A and 5B. Here, FIG. 5A is a portion in which the first $p^+$-type base region 4 is provided along the direction orthogonal to the direction in which the striped shape of the trench 16 extends; FIG. 5B is a portion in which the first $p^+$-type base region 4 is not provided along the direction orthogonal to the trench 16.

Next, the mask used during the ion implantation for forming the first $p^+$-type base region 4 is removed. Then, on the surface of the first n-type region 5a (2) and the surface of the first $p^+$-type base region 4, a second n-type region 5b (2) containing silicon carbide is formed by epitaxial growth to have a thickness of, for example, about 30 μm while an n-type impurity, for example, nitrogen atoms, is doped. The first n-type region 5a (2) and the second n-type region 5b (2) collectively form the n-type high-concentration region 5 (2). The state up to here is depicted in FIGS. 6A and 6B.

Next, on the surface (i.e., surface of the second n-type region 5b (2)) of the $n^-$-type silicon carbide epitaxial layer 2, the p-type base layer 6 is formed by epitaxial growth to have a thickness of, for example, about 1.3 μm while a p-type impurity, for example, aluminum atoms, is doped. Conditions of epitaxial growth for forming the p-type base layer 6 may be set so that, for example, the impurity concentration becomes about $4\times10^{17}/cm^3$ lower than an impurity concentration of a second $p^+$-type base region (second base region) 3. By the processes up to here, the silicon carbide semiconductor base in which the $n^-$-type silicon carbide epitaxial layer 2, the n-type high-concentration region 5 (2), and the p-type base layer 6 are stacked on the $n^+$-type silicon carbide substrate 1 is formed.

Next, on the surface of the p-type base layer 6, a non-depicted mask having predetermined openings is formed by a photolithography technique using, for example, an oxide film. Then, using the oxide film as a mask, an n-type impurity, for example, phosphorus (P) is ion implanted by an ion implantation method. As result, at a portion of the surface of the p-type base layer 6, the $n^+$-type source region 7 is formed. A dose amount during ion implantation for forming the $n^+$-type source region 7 may be set so that, for example, the impurity concentration becomes higher than that of the second $p^+$-type base region 3.

Next, the mask used during ion implantation for forming the $n^+$-type source region 7 is removed. Then, on the surface of the p-type base layer 6, a non-depicted mask having predetermined openings is formed by a photolithography technique using, for example, an oxide film. Using the oxide film as a mask, a p-type impurity, for example, aluminum, is ion implanted at the surface of the p-type base layer 6. As a result, the $p^{++}$-type contact region 8 may be formed at a portion of surface regions of the p-type base layer 6. A dose amount during ion implantation for forming the $p^{++}$-type contact region 8, for example, may be set so that the impurity concentration becomes higher than that of the p-type base layer 6. Subsequently, the mask used during ion implantation for forming the $p^{++}$-type contact region 8 is removed. A sequence in which the ion implantation for forming the $n^+$-type source region 7 and the ion implantation for forming the $p^{++}$-type contact region 8 are performed may be interchanged. The state up to here is depicted in FIGS. 7A and 7B.

Next, a heat treatment (annealing) is performed, thereby activating, for example, the first $p^+$-type base region 4, the $n^+$-type source region 7, the $p^{++}$-type contact region 8, and the $n^+$-type region 17. A temperature of the heat treatment may be, for example, about 1700 degrees C. A period of the heat treatment may be, for example, about 2 minutes. Ion implanted regions may be collectively activated by one session of the heat treatment as described above or may be activated by performing the heat treatment each time ion implantation is performed.

Figure 8:
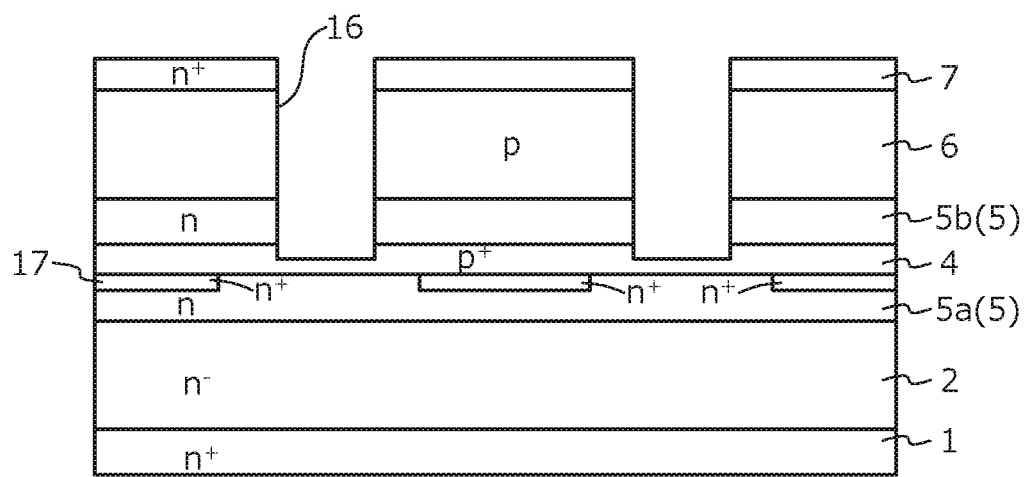
FIG. 8 is a cross-sectional view of the silicon carbide semiconductor device according to the first embodiment during manufacture.
Figure 9:
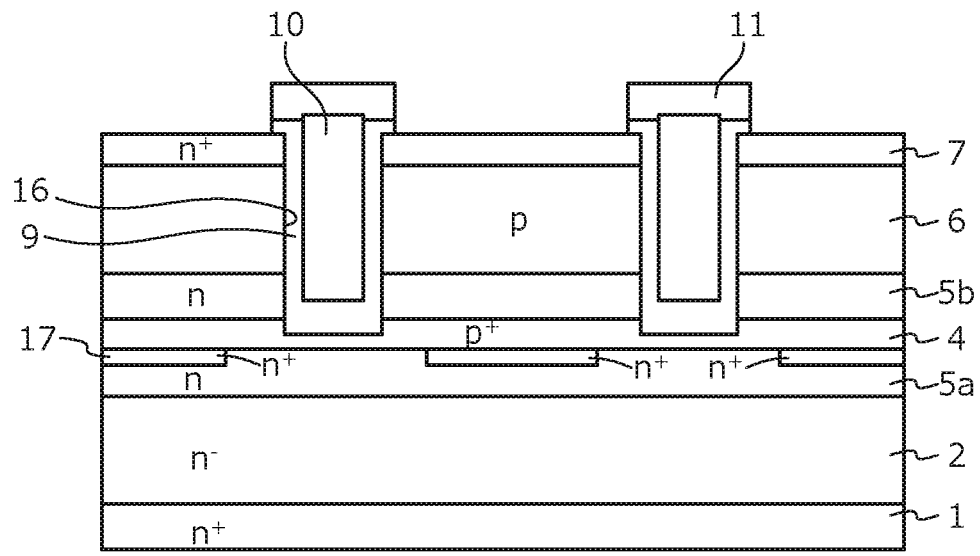
FIG. 9 is a cross-sectional view of the silicon carbide semiconductor device according to the first embodiment during manufacture.

Next, on the surface (i.e., surfaces of the $n^+$-type source region 7 and the $p^{++}$-type contact region 8) of the p-type base layer 6, a non-depicted mask having predetermined openings is formed by a photolithography technique using, for example, an oxide film. Then, the trench 16 that penetrates the $n^+$-type source region 7 and the p-type base layer 6, and reaches the n-type high-concentration region 5 (2) is formed by dry etching using the oxide film as a mask. The bottom of the trench 16 reaches the first $p^+$-type base region 4. Subsequently, the mask used for forming the trench 16 is removed. The state up to here is depicted in FIG. 8. In FIGS. 8 and 9, formation of the trench 16 is common to the configurations in FIGS. 1 and 2 and therefore, only a cross-sectional view during manufacturing corresponding to FIG. 1 is depicted.

Next, the gate insulating film 9 is formed on the surfaces of the $n^+$-type source region 7 and the $p^{++}$-type contact region 8 and along the bottom and side walls of the trench 16. The gate insulating film 9 may be formed by thermal oxidation by a heat treatment at a temperature of 1000 degrees C. in an oxygen atmosphere. Further, the gate insulating film 9 may be formed by a deposition method by a chemical reaction such as that for a high temperature oxide (HTO).

Next, on the gate insulating film 9, a polycrystalline silicon layer doped with, for example, phosphorus atoms is formed. The polycrystalline silicon layer is formed so as to be embedded in the trench 16. The polycrystalline silicon layer is patterned and left in the trench 16, thereby forming the gate electrode 10. A portion of the gate electrode 10 may protrude from a top (side where the source electrode pad 14 is provided) of the trench 16, toward the source electrode pad 14.

Next, a phosphate glass is deposited so as to cover the gate insulating film 9 and the gate electrode 10 and have a thickness of, for example, about 1 µm, thereby forming the interlayer insulating film 11. The interlayer insulating film 11 and the gate insulating film 9 are patterned and selectively removed, whereby contact holes are formed, exposing the $n^+$-type source region 7 and the $p^{++}$-type contact region 8 (when the $p^{++}$-type contact region 8 is not formed, the p-type base layer 6). Thereafter, a heat treatment (reflow) is performed, thereby planarizing the interlayer insulating film 11. The state up to here is depicted in FIG. 9.

Here, in the contact holes and on the interlayer insulating film 11, a conductive film that forms the source electrode 12 is formed. The conductive film is selectively removed, for example, leaving the source electrode 12 only in the contact hole.

Subsequently, at the second main surface of the $n^+$-type silicon carbide substrate 1, the rear electrode 13 is formed, for example, using a nickel (Ni) film. Thereafter, a heat treatment is performed at a temperature of, for example, about 970 degrees C., whereby the $n^+$-type silicon carbide substrate 1 and the rear electrode 13 form an ohmic junction.

Next, for example, by a sputtering method, for example, an aluminum film is provided so as to cover the source electrode 12 and the interlayer insulating film 11, and have a thickness of, for example, about 5 µm. Thereafter, the aluminum film is selectively removed and left so as to cover an active portion of the element overall, whereby the source electrode pad 14 is formed. Here, the active portion is a portion where the element structure is formed and through which current passes in an ON state.

Next, at the surface of the rear electrode 13, for example, titanium (Ti), nickel, and gold (Au) are sequentially stacked, whereby the drain electrode pad 15 is formed. Thus, as described, the semiconductor device depicted in FIGS. 1 and 2 is completed.

As described above, according to the first embodiment, the $n^+$-type region having a peak impurity concentration higher than the n-type high-concentration region is provided at a position between the trenches and deeper than the first $p^+$-type base region. As a result, the breakdown voltage of the first $p^+$-type base region of the bottom of the trench may be set higher than the breakdown voltage of the first $p^+$-type base region between the trenches, thereby selectively causing avalanche breakdown in the $n^+$-type region and enabling the occurrence of avalanche breakdown at the bottom of the trench to be suppressed. In this manner, avalanche current is not generated at the bottom of the trench and therefore, insulation reliability of the gate insulating film is maintained.

Figure 10:
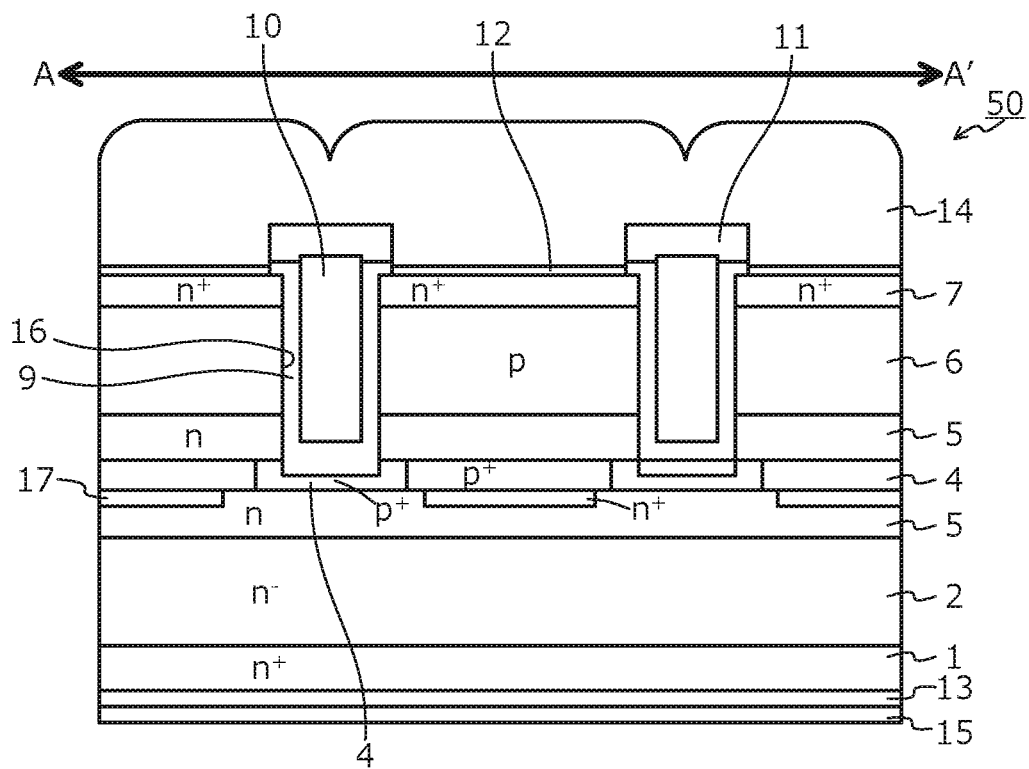
FIG. 10 is a cross-sectional view of a structure of the silicon carbide semiconductor device according to a second embodiment, along cutting line A-A' in FIG. 12.
Figure 11:
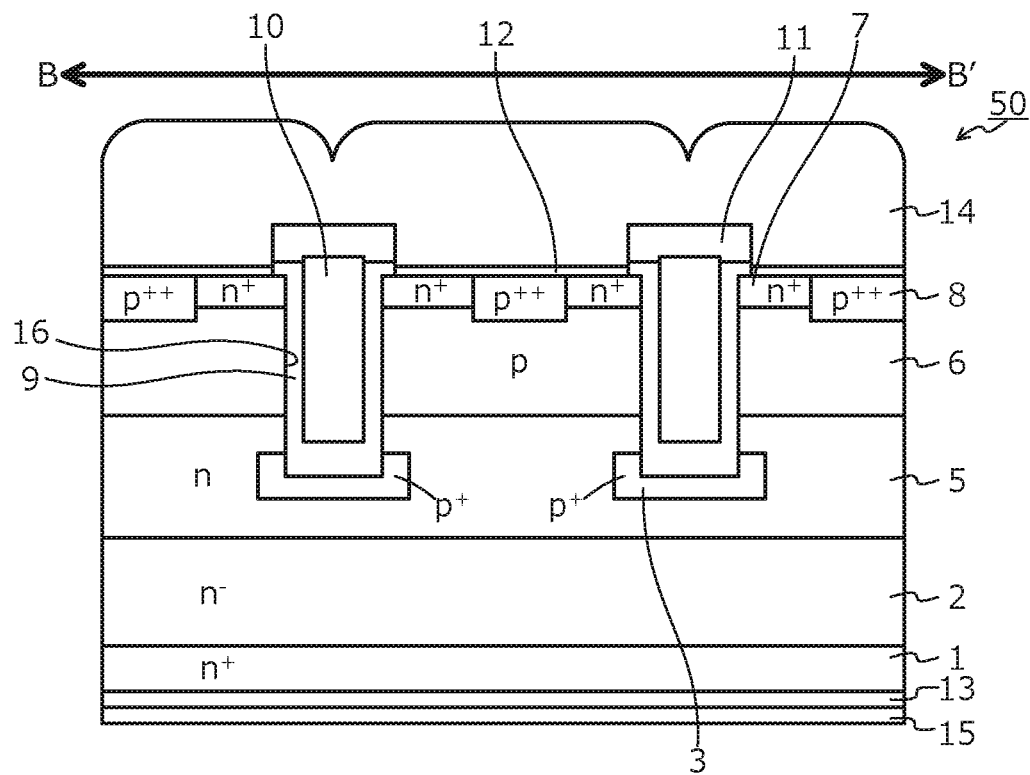
FIG. 11 is a cross-sectional view of the structure of the silicon carbide semiconductor device according to the second embodiment, along cutting line B-B' in FIG. 12.
Figure 12:
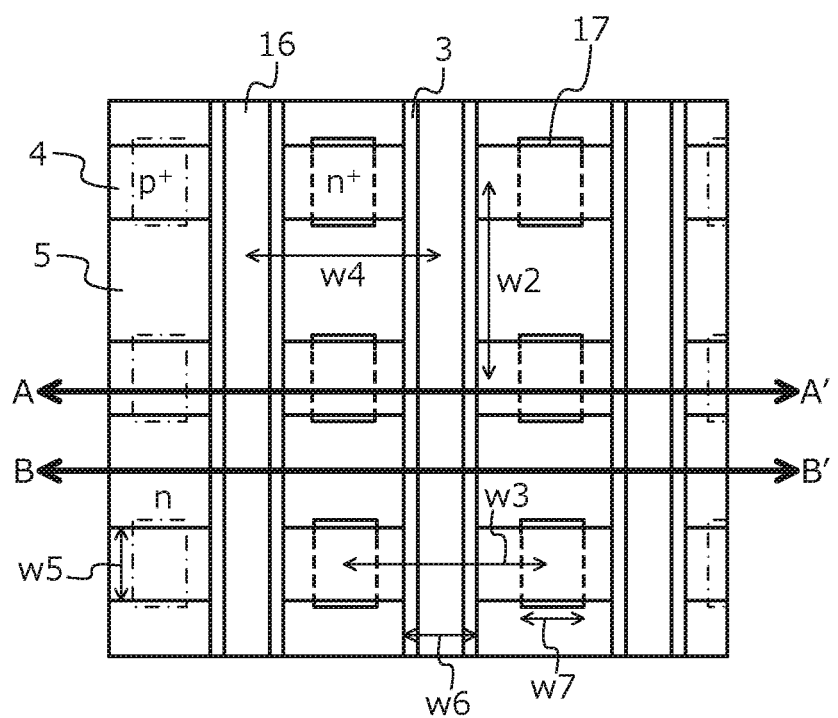
FIG. 12 is a plan sectional view of the structure of the silicon carbide semiconductor device according to the second embodiment.

FIG. 10 is a cross-sectional view of a structure of the silicon carbide semiconductor device according to a second embodiment, along cutting line A-A' in FIG. 12. FIG. 11 is a cross-sectional view of the structure of the silicon carbide semiconductor device according to the second embodiment, along cutting line B-B' in FIG. 12. FIG. 12 is a plan sectional view of the structure of the silicon carbide semiconductor device according to the second embodiment. The silicon carbide semiconductor device according to the second embodiment differs from the silicon carbide semiconductor device according to the first embodiment in that the second $p^+$-type base region 3 is included, the second $p^+$-type base region 3 being parallel to the direction in which the striped shape of the trench 16 extends and in contact with the bottom of the trench 16.

The second $p^+$-type base region 3, similarly to the first $p^+$-type base region 4, enables a pn junction between the second $p^+$-type base region 3 and the n-type high-concentration region 5 to be formed at a position near the bottom of the trench 16 in the depth direction and enables high electric field to be prevented from being applied to the gate insulating film 9 at the bottom of the trench 16. Further, the second $p^+$-type base region 3 is provided to have a width greater than the trench width and thus, enables mitigation of the electric field at a corner portion where electric field of the bottom of the trench 16 concentrates, whereby the breakdown voltage may be further increased.

Further, in the second embodiment, the first $p^+$-type base region 4 and the second $p^+$-type base region 3 are not provided in the depth direction of the $p^{++}$-type contact region 8 and therefore, reduction of the cell pitch is facilitated. Further, by the second $p^+$-type base region 3, the bottom of the trench 16 is entirely covered by a p-type region, thereby enabling easier and more stable control of the breakdown voltage as compared to the first embodiment.

Further, the first $p^+$-type base region 4 and the second $p^+$-type base region 3 may have the same impurity concentrations. Furthermore, the interval w2 between the first $p^+$-type base regions 4 may be a width (w2≈w4) about equal to an interval w4 between the second $p^+$-type base regions 3. Further, the interval w4 between the second $p^+$-type base regions 3 is a distance between a center of the second $p^+$-type base region 3 and a center of an adjacent second $p^+$-type base region 3 that is adjacent to the second $p^+$-type base region 3. Furthermore, a width w5 of the first $p^+$-type base region 4 or a width w6 of the second $p^+$-type base region 3 may be greater than a width w7 of the $n^+$-type region 17 (w5>w7, or w6>w7). The $n^+$-type region 17 may be formed by ion implantation of nitrogen without use of an oxide film mask and therefore, the first $p^+$-type base region 4 may be formed smaller, thereby enabling cell pitch to be reduced.

The silicon carbide semiconductor device according to the second embodiment may be manufactured by concurrently forming the second $p^+$-type base region 3 with the first $p^+$-type base region 4 in the method of manufacturing the silicon carbide semiconductor device according to the first embodiment.

As described above, according to the second embodiment, effects similar to those of the first embodiment may be obtained. Further, in the second embodiment, the second $p^+$-type base region that is parallel to the direction in which the striped shape of the trench extends is included at the bottom of the trench and therefore, all of the bottom of the trench is covered by a p-type region, thereby enabling more stable and easier control of the breakdown voltage as compared to the first embodiment.

Figure 13:
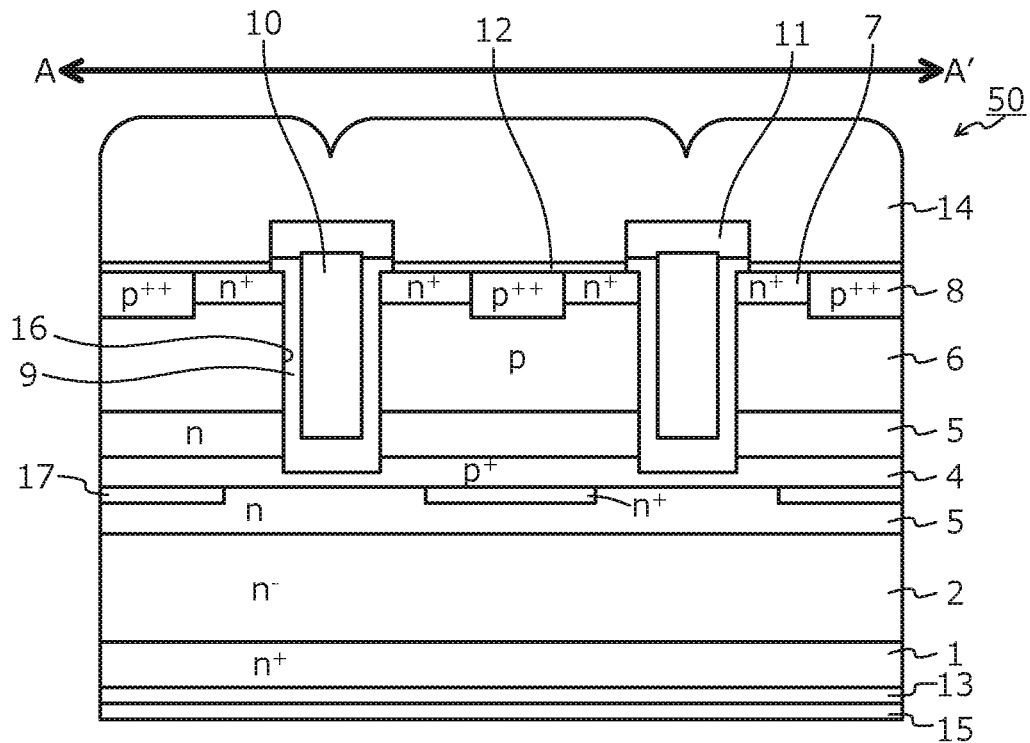
FIG. 13 is a cross-sectional view of a structure of the silicon carbide semiconductor device according to a third embodiment.

FIG. 13 is a cross-sectional view of a structure of the silicon carbide semiconductor device according to a third embodiment. In the third embodiment, a plan sectional view is similar to that of the first embodiment and therefore, is not depicted (refer to FIG. 3A). Further, a cross-sectional view of a portion where the first $p^+$-type base region 4 is not provided is similar to that of the first embodiment and therefore, is not depicted (refer to FIG. 2).

The silicon carbide semiconductor device according to the third embodiment differs from the silicon carbide semiconductor device according to the first embodiment in that the $n^+$-type region 17 is provided at a position facing the $p^{++}$-type contact region 8 in the depth direction. In other words, the $n^+$-type region 17 is provided only beneath the $p^{++}$-type contact region 8. As such, the ON resistance may be reduce more by the $n^+$-type region 17 that in the first embodiment.

The silicon carbide semiconductor device according to the third embodiment may be manufactured by forming the n+-type region 17 only beneath a formation region of the p++-type contact region 8 when the n+-type region 17 is formed in the method of manufacturing the silicon carbide semiconductor device according to the first embodiment.

As described above, according to the third embodiment, effects similar to those of the first embodiment may be obtained. Further, in the third embodiment, the n+-type region 17 is provided only beneath the p++-type contact region 8, thereby enabling the ON resistance to be reduced more than in the first embodiment.

Figure 14:
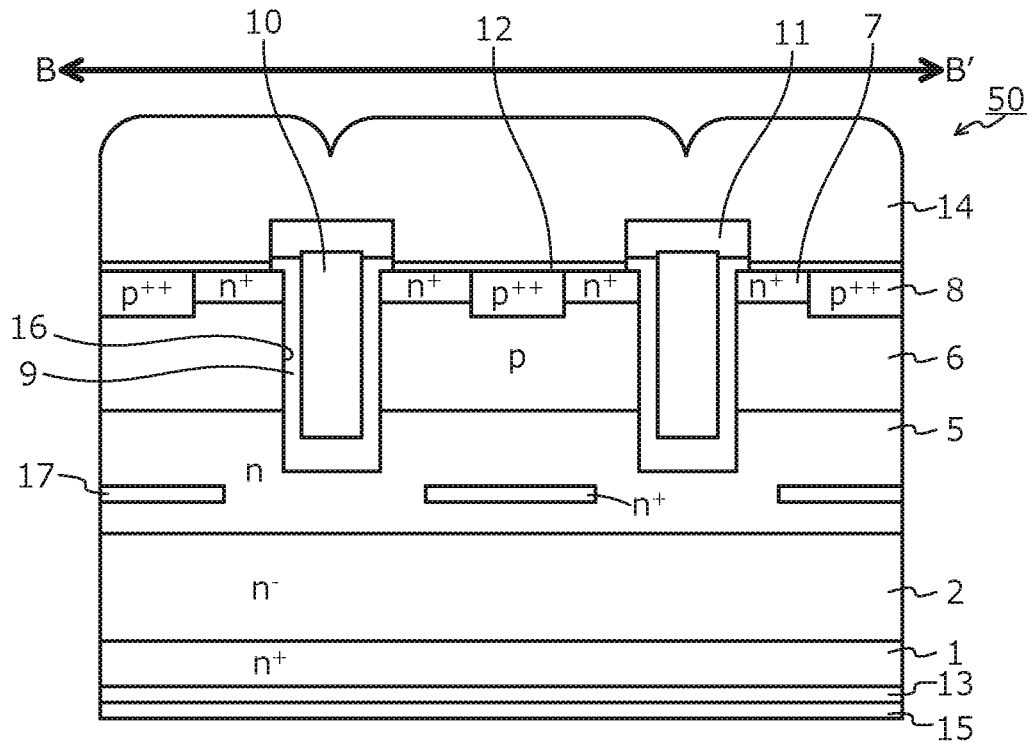
FIG. 14 is a cross-sectional view of a structure of the silicon carbide semiconductor device according to a fourth embodiment, along cutting line B-B' in FIG. 15.
Figure 15:
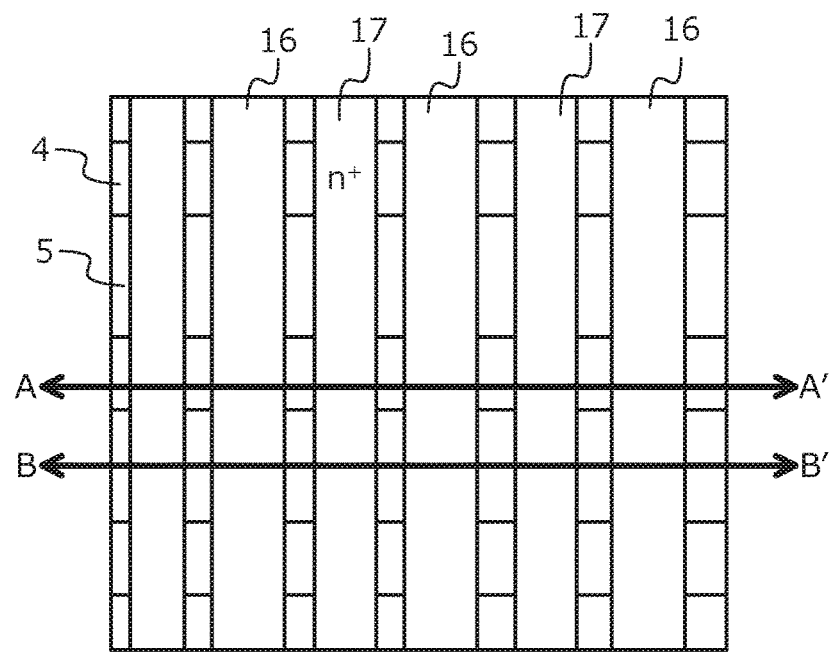
FIG. 15 is a plan sectional view of the structure of the silicon carbide semiconductor device according to the fourth embodiment.

FIG. 14 is a cross-sectional view of a structure of the silicon carbide semiconductor device according to a fourth embodiment, along cutting line B-B' in FIG. 15. FIG. 15 is a plan sectional view of the structure of the silicon carbide semiconductor device according to the fourth embodiment. Further, a cross-sectional view along cutting line A-A' in FIG. 15, where the first p+-type base region 4 is provided is similar to that of the first embodiment and therefore, is not depicted (refer to FIG. 1).

The silicon carbide semiconductor device according to the fourth embodiment differs from the silicon carbide semiconductor device according to the first embodiment in that the n+-type region 17 is provided in a striped shape parallel to the direction in which the striped shape of the trench 16 extends. With such a shape, alignment becomes unnecessary when the n+-type region 17 is formed only beneath the first p+-type base region 4 and process difficulty is reduced.

The silicon carbide semiconductor device according to the fourth embodiment may be manufactured by forming, in the method of manufacturing the silicon carbide semiconductor device according to the first embodiment, the n+-type region 17 in a striped shape parallel to the direction in which the striped shape of the trench 16 extends.

As described above, according to the fourth embodiment, effects similar to those of the first embodiment are obtained. Further, in the fourth embodiment, alignment when the first p+-type base region and the n+-type region are formed becomes unnecessary and process difficulty is reduced.

Figure 16:
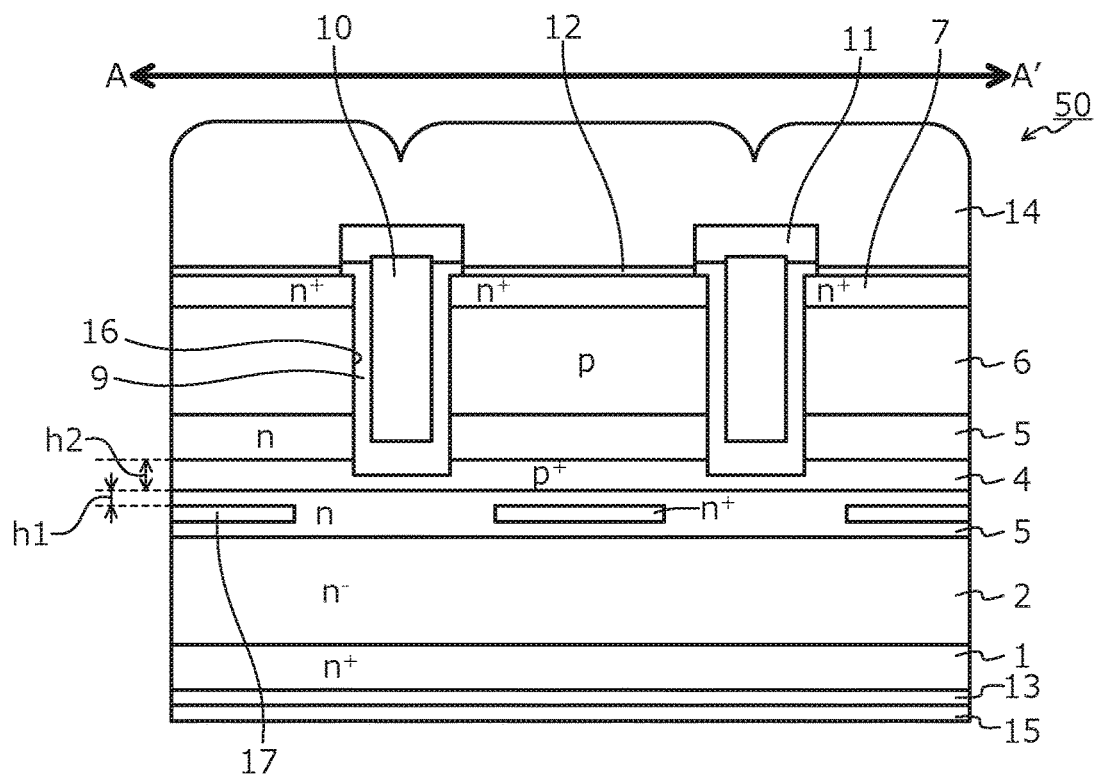
FIG. 16 is a cross-sectional view of a structure of the silicon carbide semiconductor device according to a fifth embodiment.

FIG. 16 is a cross-sectional view of a structure of the silicon carbide semiconductor device according to a fifth embodiment. A cross-sectional view of a portion in which the first p+-type base region 4 is not provided is similar to that of the first embodiment and therefore, not depicted (refer to FIG. 2). A plan sectional view of the structure of the silicon carbide semiconductor device according to the fifth embodiment is similar to that of the first embodiment and therefore, is not depicted (refer to FIG. 3A).

The silicon carbide semiconductor device according to the fifth embodiment differs from the silicon carbide semiconductor device according to the first embodiment in that the n+-type region 17 is provided in the n-type high-concentration region 5 (2). Even with such as shape, the n+-type region 17 enables the breakdown voltage of the first p+-type base region 4 at the bottom of the trench 16 to be made higher than the breakdown voltage of the first p+-type base region 4 between the trenches 16 and prevents avalanche beneath the trench, enabling reliability to be increased.

Further, a distance h1 between the n+-type region 17 and the first p+-type base region 4 may be at least smaller than a thickness h2 of the first p+-type base region 4 (h1<h2) because when equal to or greater than the thickness h2 of the first p+-type base region 4, separation is excessive, whereby electric field cannot be concentrated at the n+-type region 17.

The silicon carbide semiconductor device according to the fifth embodiment may be manufactured by forming the n+-type region 17 in the n-type high-concentration region 5 (2) when forming the n+-type region 17 in the method of manufacturing the silicon carbide semiconductor device according to the first embodiment.

As described above, according to the fifth embodiment, effects similar to those of the first embodiment may be obtained.

In the present invention, while a case in which the first main surface of the silicon carbide substrate containing silicon carbide is a (0001) plane and on the (0001) plane, a MOS gate structure is configured has been described as an example, without limitation hereto, various modifications are possible such as in the type (for example, gallium nitride (GaN) or the like) of the wide bandgap semiconductor, surface orientation of the substrate main surface, etc.

Further, in the embodiments of the present invention, while the first conductivity type is an n-type and the second conductivity type is a p-type, the present invention is similarly implemented when the first conductivity type is a p-type and the second conductivity type is an n-type.

According to the invention described above, the n+-type region (first semiconductor region of the first conductivity type) having a peak impurity concentration higher than the n-type high-concentration region (the first semiconductor layer of the first conductivity type) is provided between the trenches, at a position deeper than the first p+-type base region (first base region of the second conductivity type). As a result, the breakdown voltage of the first p+-type base region at the bottom of the trench may be made higher than the breakdown voltage of the first p+-type base region between the trenches, selectively causing avalanche breakdown in the n+-type region and enabling the occurrence of the avalanche breakdown at the bottom of the trench to be suppressed. In this manner, avalanche current is not generated at the bottom of the trench and therefore, insulation reliability of the gate insulating film is maintained.

According to the semiconductor device according to the present invention and the method of manufacturing the semiconductor device, an effect is achieved in that the occurrence of avalanche breakdown at the bottom of the trench may be suppressed.

In this manner, the semiconductor device according to the present invention and the method of manufacturing the semiconductor device is useful for high-voltage semiconductor devices used in power converting equipment and power source devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type, having a front surface and a back surface opposite to each other;
   a first semiconductor layer of the first conductivity type, provided on the front surface of the semiconductor substrate and having a first side facing the semiconductor substrate and a second side opposite to the first side, an impurity concentration of the first semiconductor layer being lower than that of the semiconductor substrate, the first semiconductor layer including a high-concentration region of the first conductivity type;
   a first semiconductor region of the first conductivity type, selectively provided in the first semiconductor layer, a peak impurity concentration of the first semiconductor region being higher than that of the first semiconductor layer;

a first base region of a second conductivity type, selectively provided in the first semiconductor layer;

a second semiconductor layer of the second conductivity type, provided on a surface of the first semiconductor layer at the second side thereof;

a second semiconductor region of the first conductivity type, selectively provided in the second semiconductor layer at a surface thereof;

a trench that penetrates the second semiconductor layer and the second semiconductor region, and reaches the first semiconductor layer;

a gate electrode provided in the trench, via a gate insulating film;

an interlayer insulating film provided on the gate electrode;

a second base region in contact with a bottom of the trench;

a first electrode in contact with the second semiconductor layer and the second semiconductor region; and a second electrode provided on the back surface of the semiconductor substrate, wherein the trench includes a plurality of trench portions, each of which extends in a first direction;

the first semiconductor region is provided between adjacent two of the plurality of trench portions, and is closer to the second electrode than is the first base region, the first semiconductor region including a plurality of first semiconductor region portions;

the first base region is in direct contact with the bottom of the trench, and extends along a second direction that intersects the first direction, at a depth that is the same as the bottom of the trench, or is closer to the second electrode than is the bottom of the trench, the first base region including a plurality of first base region portions;

the second base region extends in the first direction in parallel to the plurality of trench portions, the second base region including a plurality of second base region portions; and a width of each of the first base region portions or a width of each of the second base region portions is wider than a width of each of the first semiconductor region portions.

2. The semiconductor device according to claim 1, wherein
the second base region has a same impurity concentration as that of the first base region.

3. The semiconductor device according to claim 1, wherein
an interval between any adjacent two of the second base region portions is of a same width as an interval between any adjacent two of the first base region portions.

* * * * *